(12) United States Patent
Kinzer (10) Patent No.: US 11,381,078 B1
(45) Date of Patent: *Jul. 5, 2022

(54) POWER TRANSISTOR, A DRIVER, AND AN OVERVOLTAGE PROTECTION CIRCUIT

(71) Applicant: NAVITAS SEMICONDUCTOR, INC., El Segundo, CA (US)

(72) Inventor: Daniel M. Kinzer, El Segundo, CA (US)

(73) Assignee: Navitas Semiconductor Limited, Dublin (IE)

( * ) Notice: Subject to any disclaimer, the term of this patent is extended or adjusted under 35 U.S.C. 154(b) by 402 days.

This patent is subject to a terminal disclaimer.

(21) Appl. No.: 16/445,191

(22) Filed: Jun. 18, 2019

Related U.S. Application Data

(63) Continuation of application No. 14/827,165, filed on Aug. 14, 2015, now Pat. No. 10,355,475.

(60) Provisional application No. 62/038,063, filed on Aug. 15, 2014.

(51) Int. Cl.
*H02H 9/04* (2006.01)
*H01L 27/02* (2006.01)

(52) U.S. Cl.
CPC ......... *H02H 9/045* (2013.01); *H01L 27/0255* (2013.01); *H01L 27/0285* (2013.01)

(58) Field of Classification Search
CPC . H02H 9/045; H01L 27/0255; H01L 27/0285; H01L 27/0288
USPC ...................................................... 361/91.2
See application file for complete search history.

(56) References Cited

U.S. PATENT DOCUMENTS

| 5,079,608 A | * | 1/1992 | Wodarczyk | H01L 27/0251 257/355 |
| 5,608,595 A | * | 3/1997 | Gourab | H03K 17/0826 361/101 |
| 7,327,546 B2 | | 2/2008 | Thiery | |
| 7,732,546 B2 | | 6/2010 | Salamone et al. | |
| 2011/0215840 A1 | * | 9/2011 | Machida | H03K 3/00 327/109 |

(Continued)

OTHER PUBLICATIONS

U.S. Appl. No. 14/827,165, "Advisory Action", dated Jan. 9, 2019, 3 pages.

(Continued)

*Primary Examiner* — Kevin J Comber
(74) *Attorney, Agent, or Firm* — Kilpatrick Townsend & Stockton LLP (57) ABSTRACT

An electronic circuit is disclosed. The circuit includes a power transistor having a gate terminal, a source terminal and a drain terminal. The electronic circuit also has a driver to generate which selectively changes a voltage at the gate terminal. The driver circuit includes a pull-down switch configured to change the voltage on the gate terminal such that the resistance between the source terminal and the drain terminal increases. The electronic circuit also has an overvoltage protection circuit coupled to the gate terminal. The overvoltage protection circuit includes a selectively conductive device configured to become conductive while reverse biased in response to an overvoltage potential. While conductive, the selectively conductive device causes the resistance between the source terminal and the drain terminal to decrease. The overvoltage protection circuit is also causes the pull-down switch to be non-conductive by applying a signal to the pull-down switch.

19 Claims, 5 Drawing Sheets

(56) References Cited

U.S. PATENT DOCUMENTS

| | | | |
|---|---|---|---|
| 2011/0284862 A1* | 11/2011 | Zhang | H01L 21/8252 257/76 |
| 2013/0119378 A1 | 5/2013 | Yamazaki et al. | |
| 2013/0127500 A1 | 5/2013 | Kobayashi et al. | |
| 2013/0240894 A1* | 9/2013 | Wurfl | H01L 29/7787 257/76 |
| 2013/0256699 A1* | 10/2013 | Vielemeyer | H01L 29/0653 257/77 |
| 2014/0085760 A1* | 3/2014 | Lui | H01L 27/0255 361/91.5 |
| 2014/0118874 A1* | 5/2014 | Kandah | H03K 17/0826 361/93.1 |
| 2014/0346522 A1* | 11/2014 | Disney | H01L 23/49575 257/76 |
| 2016/0049786 A1 | 2/2016 | Kinzer | |

OTHER PUBLICATIONS

U.S. Appl. No. 14/827,165, "Final Office Action", dated Oct. 31, 2018, 15 pages.

U.S. Appl. No. 14/827,165, "Non-Final Office Action", dated Nov. 30, 2017, 11 pages.

U.S. Appl. No. 14/827,165, "Non-Final Office Action", dated Jun. 13, 2018, 13 pages.

U.S. Appl. No. 14/827,165, "Notice of Allowance", dated Feb. 15, 2019, 11 pages.

* cited by examiner

POWER TRANSISTOR, A DRIVER, AND AN OVERVOLTAGE PROTECTION CIRCUIT

CROSS-REFERENCES TO OTHER APPLICATIONS

This application is a continuation of and claims priority to U.S. patent application Ser. No. 14/827,165, filed on Aug. 14, 2015, entitled "GaN Overvoltage Protection Circuit", which claims priority to U.S. provisional patent application Ser. No. 62/038,063, filed on Aug. 15, 2014, entitled "GaN Overvoltage Protection Circuit". Each of the above-mentioned applications are hereby incorporated by reference in their entirety for all purposes.

FIELD

The present invention relates generally to transistors and in particular to GaN-based power transistors with overvoltage protection circuits.

BACKGROUND

Gallium-nitride (GaN) devices are known to lack ruggedness to withstand overvoltage stress, especially avalanche stress. The ability of silicon devices such as MOSFETs to withstand voltage spikes with reasonable energy levels has been widely used as an extra level of protection in the design of power electronic circuits. Users of such devices have come to expect that transistors can handle voltage spikes, and it significantly reduces the complexity of power electronic design if they can. It can also allow the use of lower breakdown voltage rated devices, since the user can reduce the amount of voltage guard band applied to protect against voltage surges. Such surges can arise from grid voltage anomalies, lightning strikes, current transients interacting with inductive circuit elements, and other causes.

Current GaN devices address this weakness by overdesigning the transistors to break at a voltage far in excess of the rated voltage. For example, a device with a nominal 650 volt maximum drain-source voltage rating might be designed with a breakdown voltage of 800-1100 volts, while a silicon device with a rating of 650 volts will usually have a breakdown voltage of 700-750 volts. In some applications, this overdesign causes the GaN device to be larger and higher in on-resistance, increasing the cost and reducing the performance in the intended application. Further, in some applications it has also limited the use of GaN devices, since users expect their power transistors to have overvoltage clamping capability, and are reluctant to change to a device that might compromise the ruggedness or reliability of their circuit.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

SUMMARY

Some embodiments of the present invention relate to overvoltage protection circuits for GaN power transistors and methods of employing such circuits. Some embodiments relate to diodes or transistors that breakdown at a voltage less than the maximum allowable voltage for the power transistor and temporarily conduct during the overvoltage condition to turn on the power transistor so it does not get damaged. Some embodiments use the temporarily conducting diode to activate more complex overvoltage protection circuits that can perform additional functions such as disabling gate drives and notifying separate control circuits that an overvoltage condition has occurred.

In some embodiments an electronic circuit includes a power transistor having a gate terminal, a source terminal and a drain terminal. The circuit also includes an overvoltage protection circuit coupled to the gate terminal of the power transistor. The overvoltage protection circuit is configured to protect the power transistor from an overvoltage potential between the source terminal and the drain terminal by temporarily changing a voltage on the gate terminal such that a resistance between the source terminal and the drain terminal decreases.

In some embodiments the power resistor is a GaN-based device and the overvoltage protection circuit comprises a voltage sensing circuit coupled to the drain terminal. In further embodiments the voltage sensing circuit includes a diode coupled between the drain terminal and the gate terminal. In yet further embodiments the diode includes a plurality of series connected diodes. In one embodiment the power transistor is a GaN-based high electron mobility transistor (HEMT).

In some embodiments the voltage sensing circuit is a transistor coupled between the drain terminal and the gate terminal of the power transistor. In further embodiments the voltage sensing circuit starts to conduct current when a voltage potential between the drain terminal and the source terminal goes above a threshold voltage. In yet further embodiments the threshold voltage is selected to be higher than an intended use voltage of the power transistor, but lower than a voltage that damages the power transistor.

In some embodiments, when above the threshold voltage, the sensing circuit conducts enough current to bias the gate terminal of the power transistor such that the power transistor conducts a current between the source terminal and the drain terminal, and a circuit that keeps the power device off is disabled. In further embodiments, when above the threshold voltage, the sensing circuit sends a signal to a control system.

In some embodiments the voltage sensing circuit includes a GaN diode or a GaN transistor having a GaN buffer layer and an AlGaN barrier layer forming a two-dimensional electron gas. In other embodiments the voltage sensing circuit can conduct more than 10 milliamperes of current without failure or reliability degradation. In further embodiments the voltage sensing circuit includes a GaN-based transistor having a resistive and elongated gate structure configured to uniformly spread current flow into the gate terminal of the power transistor.

In some embodiments the power transistor is disposed on a first die and at least a portion of the voltage sensing circuit is diposed on a second die that is co-packaged with the power transistor. In other embodiments the power transistor and at least one element of the voltage sensing circuit are disposed on a unitary GaN-based die. In further embodiments the voltage sensing circuit is configured to turn on a drive transistor that turns on the power transistor. In yet further embodiments the power transistor is a high side transistor in a synchronous power converter.

In some embodiments a protected circuit comprises a power transistor having a gate terminal, a source terminal and a drain terminal with a voltage potential applied between the drain terminal and the source terminal. An overvoltage protection circuit is coupled to the gate terminal of the power transistor and configured to turn on the power transistor when the voltage potential exceeds a predetermined value.

In some embodiments the voltage sensing circuit is configured to activate an output of a comparator in response to detecting the overvoltage potential, and the output turns on a pass transistor and disables one or more power transistor gate drive transistors. In further embodiments after the output of the comparator is activated and the overvoltage potential increases, an operational amplifier is configured to transmit a gate drive signal through the pass transistor to the gate terminal of the power transistor.

In some embodiments the voltage sensing circuit is configured to exceed a reference voltage when a voltage potential between the drain terminal and the source terminal goes above a threshold voltage. In further embodiments the voltage sensing circuit includes a diode coupled to the drain terminal that starts to conduct current when a voltage potential between the drain terminal and the source terminal goes above a threshold voltage and the diode supplies current to a transistor that transmits an amplified gate drive signal to the gate terminal of the power transistor.

In some embodiments an electronic component comprises a package base and a GaN-based power transistor secured to the package base. The power transistor includes a gate terminal, a drain terminal and a source terminal. The electronic component further includes at least one component of overvoltage protection circuit wherein the overvoltage protection circuit is coupled to the gate terminal of the power transistor and is configured to protect the power transistor from an overvoltage potential between the source terminal and the drain terminal. The power transistor does this by temporarily changing a voltage on the gate terminal such that a resistance between the source terminal and the drain terminal decreases. The electronic component also includes an electrically insulative mold compound encapsulating at least a portion of a top surface of the package base, the power transistor and the at least one component of the overvoltage protection circuit. In some embodiments the at least one component of the overvoltage protection circuit is a GaN-based diode. In further embodiments In some embodiments a method of protecting a GaN-based power transistor from an overvoltage condition comprises sensing a voltage that exceeds a threshold voltage across a source terminal and a drain terminal of a power transistor. The method also comprises temporarily activating a gate terminal of the power transistor with a voltage sensing circuit to reduce a resistance between the source terminal and the drain terminal.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION

Some embodiments of the present invention relate to overvoltage protection circuits for GaN power transistors and methods of employing such circuits. For example, some embodiments relate to diodes or transistors that breakdown at a voltage less than the maximum allowable voltage for the power transistor and temporarily conduct during the overvoltage condition to turn on the power transistor so it does not get damaged. In another example, other circuits use the temporarily conducting diode to activate more complex overvoltage protection circuits that can perform additional functions such as disabling gate drives and notifying separate control circuits that an overvoltage condition has occurred. In another example a resistor divider network is used along with a reference voltage circuit and one or more comparators and/or operational amplifiers to sense when an overvoltage condition has occurred and protect the power transistor. While the present invention can be useful for a wide variety of configurations, some embodiments of the invention are particularly useful for GaN-based power transistors with integrated overvoltage protection circuits, as described in more detail below.

In order to better appreciate the features and aspects of power transistors with overvoltage protection circuits according to the present invention, further context for the invention is provided in the following section by discussing one particular implementation of a GaN transistor with an overvoltage protection circuit according to embodiments of the present invention. These embodiments are for example only and other embodiments may be employed in other electronic circuits.

Figure 1:
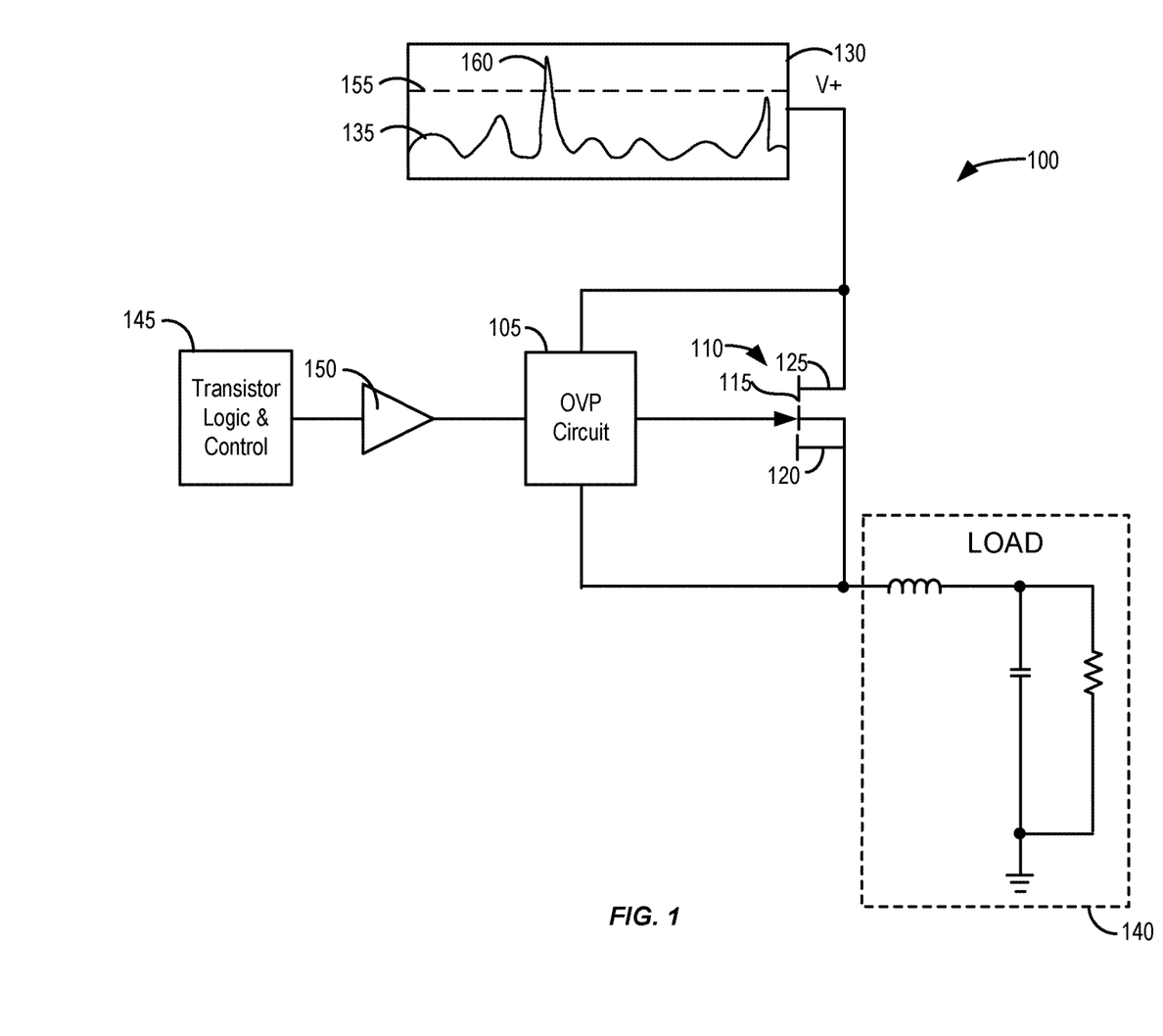
FIG. 1 is a simplified schematic of a power transistor with an overvoltage protection circuit according to an embodiment of the invention.

FIG. 1 depicts a schematic of an electronic circuit 100 having an overvoltage protection circuit 105 coupled to a power transistor 110. Power transistor 110 may have a gate terminal 115, a source terminal 120 and a drain terminal 125. Overvoltage protection circuit 105 may be coupled to gate terminal 115 of power transistor 110. Overvoltage protection circuit 105 may also be coupled to drain terminal 125 and/or source terminal 120, and be configured to protect power transistor 110 from an overvoltage potential applied between the source terminal and the drain terminal, as explained in more detail below.

In some embodiments drain terminal 125 may be coupled to a voltage source 130 that may have a fluctuating voltage level 135. Source terminal 120 may be coupled to a load 140 such that when a transistor logic and control circuit 145 activates a drive circuit 150, gate terminal 115 is activated and power transistor 110 turns on allowing current to flow between drain terminal 125 and source terminal 120. Thus, when power transistor 110 is in an off state, it creates a high resistance between source terminal 120 and drain terminal 125 that blocks voltage and current from reaching load 140. However, when power transistor 110 is in an on state, power transistor 110 allows current to flow from voltage source 130 to load 140 by reducing a resistance between its source terminal 120 and its drain terminal 125.

Continuing to refer to FIG. 1, in some embodiments power transistor 110 may have a maximum safe operating breakdown voltage illustrated by line 155. That is, maximum safe operating breakdown voltage 155 of power transistor 110 may be the maximum voltage the power transistor can support when in an off state. At voltages above maximum safe operating breakdown voltage 155, power transistor 110 my breakdown between source terminal 120 and drain terminal 125 allowing current to flow when in the off state and possibly causing performance degradation and/or damage to the power transistor. Overvoltage protection circuit 105 may be engaged, as described below, to protect power transistor 110 from overvoltage conditions such as spike 160.

Figure 2:
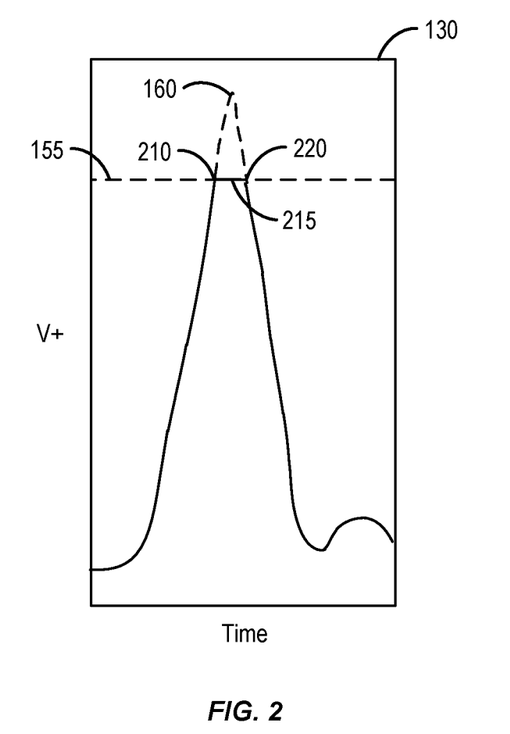
FIG. 2 is an exploded view of a portion of the input voltage signal for the simplified schematic illustrated in FIG. 1.

Now referring to FIG. 2 a portion of voltage level 135 is shown in greater detail where voltage spike 160 temporarily exceeds maximum safe operating breakdown voltage 155. More specifically, at point 210, power transistor 110 is in the off state and voltage level 135 begins to exceed maximum safe operating breakdown voltage 155. At point 210, overvoltage protection circuit 105 (see FIG. 1) may be configured to engage and stop the voltage potential between source terminal 120 and drain terminal 125 of power transistor 110 from rising by temporarily turning on power transistor 115. This may stop the voltage potential between source terminal 120 and drain terminal 125 from rising, causing the voltage potential across power transistor 115 to instead follow line 215 such that in effect, peak 205 is "clipped" and voltage level 135 does not exceed maximum safe operating breakdown voltage 155. At point 220, voltage level 135 reduces below maximum safe operating breakdown voltage 155 and overvoltage protection circuit 105 (see FIG. 1) may disengage and allow power transistor 110 to transition back to the off state.

Therefore, during the overvoltage condition, transistor logic and control circuit 145 may be commanding power transistor 110 to be in the off state, however during the transient condition power transistor 110 is actually in the on state. This temporary added energy that power transistor 110 allows to pass through to load 140 may be accommodated in the load components and may not affect the stability of the control system. Various design choices may be made in the design of the load components to accommodate a particular duration and frequency of overvoltage transient conditions.

Figure 3A:
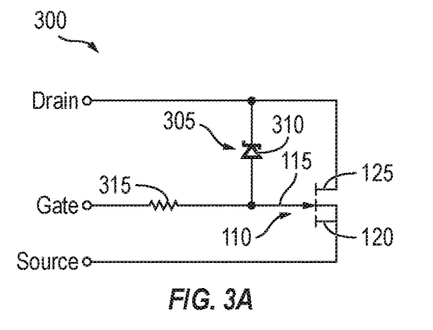
FIG. 3A is a simplified schematic of a power transistor with a diode-based overvoltage protection circuit according to an embodiment of the invention.

Now referring to FIG. 3A a schematic 300 of one embodiment of a power transistor 110 with an overvoltage protection circuit 305 is illustrated. In this embodiment, overvoltage protection circuit 305 is a diode 310 coupled between gate terminal 115 and drain terminal 125 of power transistor 110. In some embodiments diode 310 may be configured to have a breakdown voltage sufficiently below the breakdown voltage of power transistor 110. In such embodiments, when diode 310 breaks down, current may flow from drain terminal 125 (i.e., from voltage source 130 in FIG. 1), through diode 310 and into gate terminal 115 of power transistor 110. This may apply a voltage to gate terminal 115 and induce power transistor 110 to turn on. This may allow power transistor 110 to support over voltage conditions like voltage peak 205 (see FIG. 2) in a safe operating area (SOA) manner such that it doesn't reach avalanche breakdown, thereby enhancing the overvoltage ruggedness of power transistor 110. In further embodiments a resistor 315 may be placed on the gate line and located between drive circuit 150 (see FIG. 1) and gate terminal 115.

In one embodiment power transistor 110 may be a GaN-based high electron mobility transistor (GaN HEMT) device while in other embodiments power transistor may be any other type of semiconductor device, including but not limited to, silicon. In some embodiments the GaN-based transistor may have a resistive and elongated gate structure configured to uniformly spread current flow into the gate terminal of the power transistor. In further embodiments diode 305 may also be a Zener-type GaN based device, while in further embodiments it may be any other type of semiconductor device, including but not limited to, silicon. In some embodiments the GaN-based transistor and/or the GaN-based diode may have a GaN buffer layer and an AlGaN barrier layer forming a two-dimensional electron gas. In further embodiments diode 310 may be designed with an appropriate breakdown voltage as discussed above and the ability to withstand current in the range of 10-500 milliamperes, while in other embodiments the withstanding current may be 50 to 250 milliamperes. In another embodiment the withstanding current may be approximately 100 milliamperes.

In another embodiment diode 310 may be made from a series string of polysilicon diodes to create a high voltage avalanche diode. In one embodiment the string of polysilicon diodes may be fabricated on the device prior to an ohmic contact anneal process or later in the fabrication process before the aluminum or copper interconnect metallization. In further embodiments the string of polysilicon diodes may be subjected to a thermal treatment including, but not limited to, a furnace a rapid thermal anneal or a laser anneal. In yet further embodiments the string of polysilicon diodes may be insulated from the GaN epitaxial layer by a relatively thick dielectric capable of supporting a relatively high voltage. In some embodiments each polysilicon diode may have a 6-7 volt breakdown voltage, so a string of 100 would have approximately a 600-700 volt breakdown voltage. Any number of series connected diodes are within the scope of this disclosure.

In a further embodiment diode 310 may be replaced with a clamping transistor that is coupled between coupled between gate terminal 115 and drain terminal 125 of power transistor 110. In some embodiments the clamping transistor may be configured to turn on at a voltage sufficiently below the breakdown voltage of power transistor 110. In such embodiments, when the clamping transistor is in the on state, current may flow from voltage source 130 (see FIG. 1), through diode 310 and into gate terminal 115 of power transistor 110, raising its voltage and inducing the power transistor to turn on. This may allow power transistor 110 to support over voltage conditions as discussed above. The clamping transistor can be activated by an overvoltage protection circuit, for example, as discussed below. Other embodiments may use other electronic elements to couple gate terminal 115 to drain terminal 125 during overvoltage conditions.

In some embodiments, power transistor 110 may be a portion of a circuit such as a high side transistor in a synchronous DC/DC half-bridge or full-bridge converter. In other embodiments power transistor 110 may be a switch in a circuit that is subject to input voltage noise. In yet further embodiments power transistor 110 may be employed in any other type of a circuit that needs protection from high voltage transients.

Figure 3B:
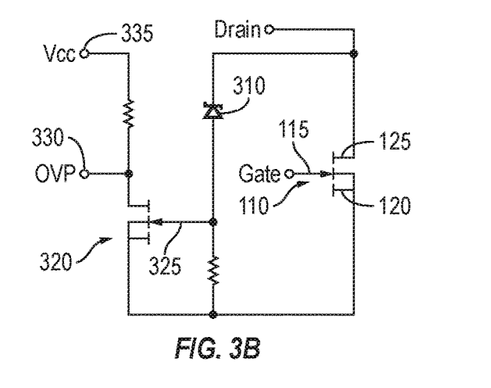
FIG. 3B is a simplified schematic of a power transistor with a diode-based overvoltage protection circuit coupled to a trigger transistor according to an embodiment of the invention

Now referring to FIG. 3B, a circuit similar to circuit 300 in FIG. 3A is illustrated, however instead of diode 310 connecting the gate of the power transistor to the drain of the power transistor, it turns on an trigger transistor 320 that can trigger an overvoltage protection circuit to protect the power transistor by taking myriad actions, as explained in more detail below.

When diode 310 conducts current, as discussed above in FIG. 3A, it pulls up gate terminal 325 of trigger transistor 320 so the trigger transistor is in an on state. The on state connects power supply (Vcc) 335 to source terminal 120 (i.e., ground) and pulls node 330 from a low state (i.e., at or near ground) to a high state (i.e., at or near Vcc). This transition in states which is initiated by the overvoltage condition can be used by an overvoltage protection circuit to take myriad actions, including connecting gate terminal 115 of power transistor 110 to its drain terminal 125 to clamp the overvoltage transient.

Figure 4:
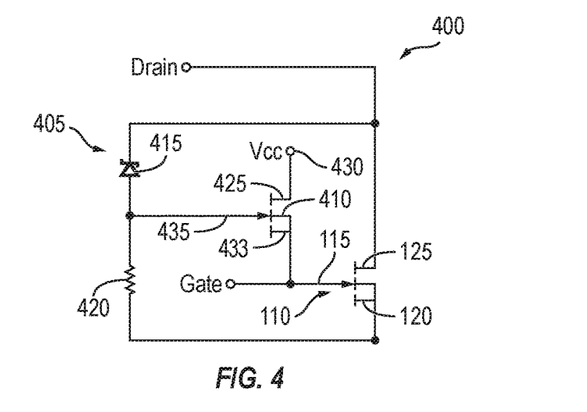
FIG. 4 is a simplified schematic of a power transistor with a diode-based overvoltage protection circuit coupled to a drive transistor according to an embodiment of the invention.

Now referring to FIG. 4 a schematic 400 of another embodiment of a power transistor 110 with an overvoltage protection circuit 405 is illustrated. In this embodiment, a two-stage circuit (or multi-stage circuit in other embodiments) can be configured such that the diode pulls up the gate of a small drive transistor, which in turn pulls up the gate of the larger power transistor. In such embodiments, the current in the diode may be amplified to give a stronger and/or faster pull-up drive for the power transistor, as described in more detail below.

In this embodiment, overvoltage protection circuit 405 includes a drive transistor 410, a diode 415 and a resistor 420. In some embodiments, drive transistor 410 may also be called an amplifying transistor and has a drain 425 coupled to a power supply (Vcc) 430, and a source 433 coupled to gate terminal 115 of power transistor 110. Diode 415 may be coupled between drain 125 of power transistor 110 and gate 435 of drive transistor 410. Resistor 420 may be coupled between gate 435 of drive transistor 410 and source 120 of power transistor 110.

In some embodiments diode 415 may be configured to have a breakdown voltage sufficiently below the breakdown voltage of power transistor 110 such that the diode may break down at a threshold voltage lower than the power transistor. In such embodiments, when diode 415 breaks down, current may flow from drain terminal 125 (i.e., voltage source 130 in FIG. 1), through diode 415 and into gate terminal 435 of drive transistor 410 raising its voltage and inducing the drive transistor to turn on. This may allow drive transistor 410 to allow current to flow from power supply (Vcc) 430 to gate terminal 115 of power transistor 110. Such embodiments may be used to amplify the gate drive signal applied to gate terminal 115 such that power transistor 110 turns on faster and/or with a lower resistance than if it was driven only with the current supplied through diode 415 as illustrated in FIG. 3A.

Figure 5:
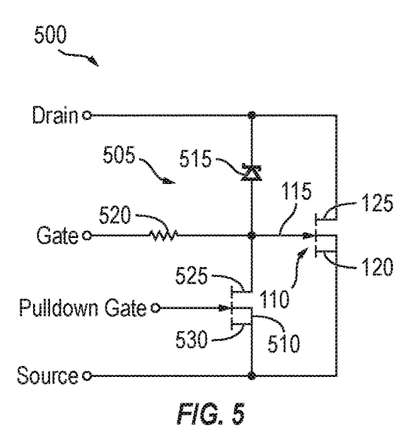
FIG. 5 is a simplified schematic of a power transistor with a diode-based overvoltage protection circuit coupled to a pulldown transistor according to an embodiment of the invention.

Now referring to FIG. 5 a schematic 500 of another embodiment of a power transistor 110 with an overvoltage protection circuit 505 is illustrated. In this embodiment a pulldown transistor in the overvoltage protection circuit may be turned on to keep the gate of the main power transistor biased "off," or near source potential to make the power transistor more stable, remaining in the off state. During a transient overvoltage condition, the diode is configured to be able to source enough current to overcome the pulldown drive circuit and lift the gate voltage above the threshold voltage to conduct the necessary overvoltage current in the power transistor, as described in more detail below.

In this embodiment, overvoltage protection circuit 505 includes a pulldown transistor 510, a diode 515 and a resistor 520. In some embodiments, pulldown transistor 510 has a drain 525 coupled to gate terminal 115 of power transistor 110, and a source 530 coupled to source terminal 120 of power transistor 110. Diode 515 may be coupled between drain 125 (i.e., voltage source 130 in FIG. 1) of power transistor 110 and gate 115 of power transistor 110. Resistor 520 may be coupled between gate drive circuit 150 (see FIG. 1) and gate terminal 115 of power transistor 110.

In some embodiments, pulldown transistor 510 may be held in an on state while power transistor 110 is in an off state such that the power transistor remains off even when there is noise and transients within circuit 500. Further, in some embodiments diode 515 may be configured to have a breakdown voltage sufficiently below the breakdown voltage of power transistor 110 such that the diode may break down at a threshold voltage lower than the power transistor. In such embodiments, when diode 515 breaks down, current may flow from drain terminal 125 (i.e., voltage source 130 in FIG. 1), through diode 515 and into gate terminal 115 of power transistor 110 raising its voltage and inducing the power transistor to turn on. The current carried by diode 515 may be designed to overcome the current carried by pulldown transistor 510 such that gate terminal 115 of power transistor 110 rises above the threshold voltage and the power transistor turns on.

Figure 6:
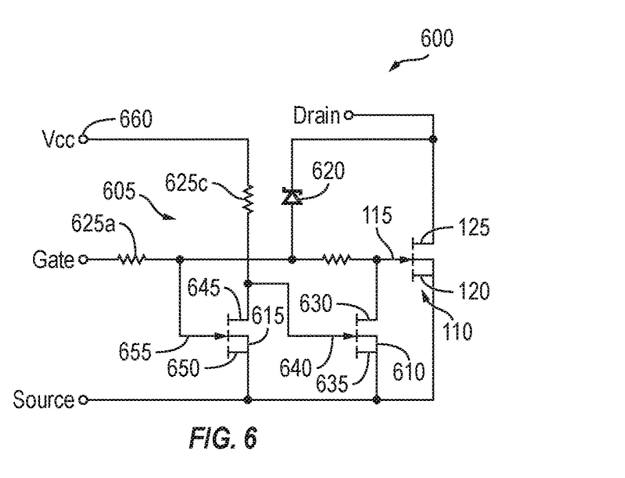
FIG. 6 is a simplified schematic of a power transistor with a diode-based overvoltage protection circuit coupled to a pulldown and a pulldown drive transistor according to an embodiment of the invention.

Now referring to FIG. 6 a schematic 600 of another embodiment of a power transistor 110 with an overvoltage protection circuit 605 is illustrated. In this embodiment overvoltage protection circuit 600 can be configured to turn off a pulldown transistor that is holding the gate at source potential when the high voltage transistor is on, in order to avoid excessively high current flowing in the voltage limiting device and the circuit holding the gate, as described in more detail below.

In this embodiment, overvoltage protection circuit 605 includes a pulldown transistor 610, a pull down drive transistor 615, a diode 620 and a resistors 625a-625c. In some embodiments, pulldown transistor 610 has a drain 630 coupled to gate terminal 115 of power transistor 110, and a source 635 coupled to source 120 of the power transistor. A gate 640 of pulldown transistor 610 may be coupled to a drain 645 of pulldown drive transistor 615 and a source 650 may be coupled to source 120 of power transistor 110. Diode 620 may be coupled between drain terminal 125 of power transistor 110 and coupled to gate terminal 115 of power transistor 110 through resistor 625b. Resistor 625a may be disposed between drive circuit 150 (see FIG. 1) and connection to gate 655 of pulldown drive transistor 615. Resistor 625c may be coupled between a power supply (Vcc) 660 and drain 645 and gate 640 connections.

In some embodiments, power supply (Vcc) 660 may maintain pulldown transistor 610 in an on state that keeps gate terminal 115 shorted to source terminal 120 such that power transistor 110 is maintained securely in an off state. However, in some embodiments diode 620 may be configured to have a breakdown voltage sufficiently below the breakdown voltage of power transistor 110 such that the diode may break down at a threshold voltage lower than the power transistor. In such embodiments, when diode 620 breaks down due to an overvoltage transient, current may flow from drain terminal 125 (i.e., voltage source 130 in FIG. 1), through diode 620 and into gate 655 of pulldown drive transistor 615 raising its voltage and inducing the pulldown drive transistor to turn on. Pulldown drive transistor 615 then shorts gate 640 of pulldown transistor 610 to source 635 turning it off and releasing gate terminal 115 of power transistor 110 so that the power transistor may turn on. Gate terminal 115 of power transistor 110 may be turned on by current flowing through diode 620, through resistor 625*b* and into the gate terminal.

Figure 7:
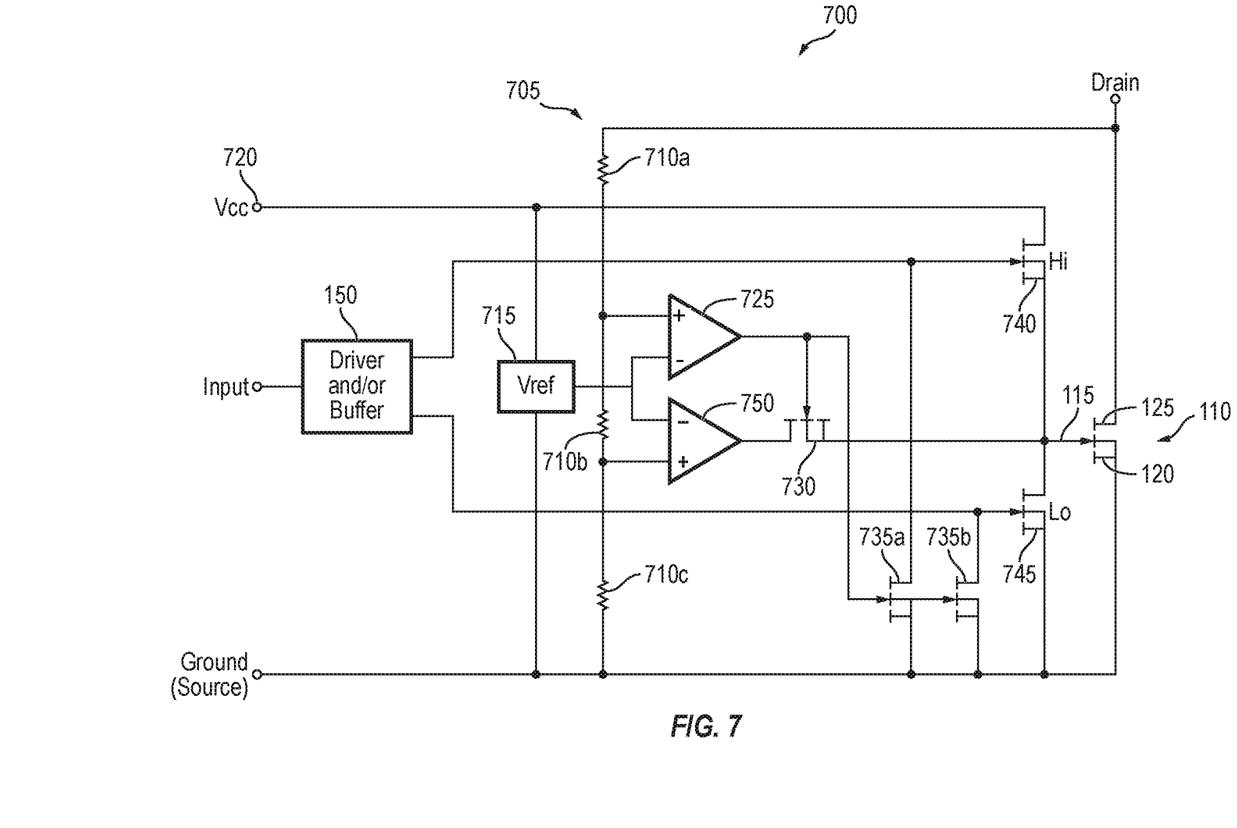
FIG. 7 is a simplified schematic of a power transistor with a resistor divider-based overvoltage protection circuit according to an embodiment of the invention.

Now referring to FIG. 7 a schematic 700 of another embodiment of a power transistor 110 with an overvoltage protection circuit 705 is illustrated. In this embodiment the overvoltage protection circuit can be configured to use a resistor divider network to send a signal to a control system that first turns off a gate drive circuit then turns on the power transistor during overvoltage transients, as described in more detail below.

In this embodiment, overvoltage protection circuit 705 includes a resistor divider network including resistors 710*a*-710*c* that are coupled between drain terminal 125 and source terminal 120 of power transistor 110. A reference voltage generator 715 is coupled between a power supply (Vcc) 720 and source 120, and generates a reference voltage signal. A comparator 725 receives input from the resistor divider network and compares it to reference voltage generator 715 voltage. When the input voltage from the resistor divider network is above the reference voltage comparator 725 supplies an output signal to a pass transistor 730 and two drive disable transistors 735*a*, 735*b*. A gate driver circuit 150 supplies drive signals to a high side transistor 740 and a low side transistor 745, each of which are coupled to gate terminal 115 of power transistor 110. An operational amplifier 750 receives input from the resistor divider network and compares it to reference voltage generator 715 voltage. When the input from the resistor divider network is greater than the reference voltage operational amplifier 750 supplies an output through pass transistor 730 to gate terminal 115. In some embodiments the resistor divider network may be configured to turn on comparator 725 before operational amplifier 750.

In one embodiment, power supply (Vcc) 720 may supply power to reference voltage generator 715 such that it supplies a continuous reference voltage signal to comparator 725 and operational amplifier 750. Instead of using a diode that breaks down during an overvoltage transient, as discussed in the embodiments above, this embodiment uses a resistor divider network connected between drain terminal 125 and source terminal 120. When power transistor 110 is in an off state and a voltage across drain terminal 125 and source terminal 120 rises due to an overvoltage transient, voltages at all points along the resistor divider network increase proportionately.

In some embodiments the resistor divider network may be used as a sensing circuit such that when an the power transistor experiences an overvoltage transient above the threshold voltage of power transistor, the sensing circuit sends a signal to a control system, such as comparator 725 and operational amplifier 750. Resistors 710*a*-710*c* may be selected such that at a voltage potential that is below the breakdown voltage of power transistor, comparator 725 sends an output signal to pass transistor 730, turning it to an on state and connecting the output of operational amplifier 750 to gate terminal 115 of power transistor. Additionally, the output signal of comparator 725 sends signals to drive disable transistors 735*a*, 735*b*, also turning them on and pulling the high transistor 740 and low transistor 745 drive lines to ground (i.e., source terminal 120 potential of power transistor 110). This effectively disables gate drive circuit 150 from transmitting drive signals to high side transistor 740 and low side transistor 745. As the voltage across power transistor 110 continues to rise, operational amplifier is configured to send a signal through pass transistor 730 to gate terminal 115 of power transistor 110 to turn it on during the transient overvoltage condition.

Figure 8:
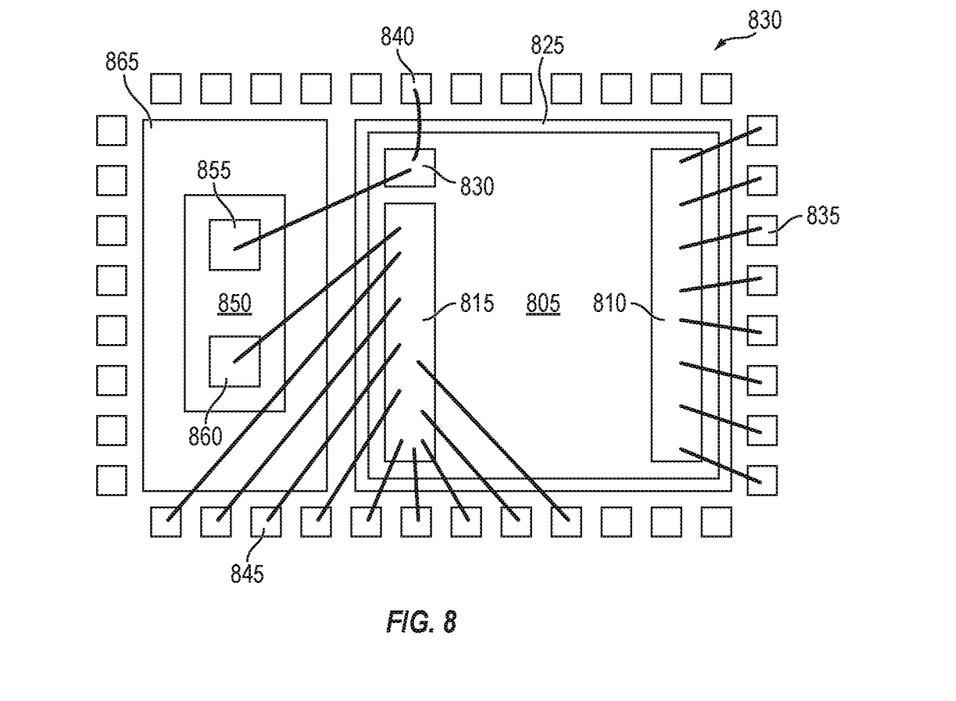
FIG. 8 is a simplified illustration of the interior of an electronic package including power transistor with a diode-based overvoltage protection circuit according to an embodiment of the invention.
Figure 9:
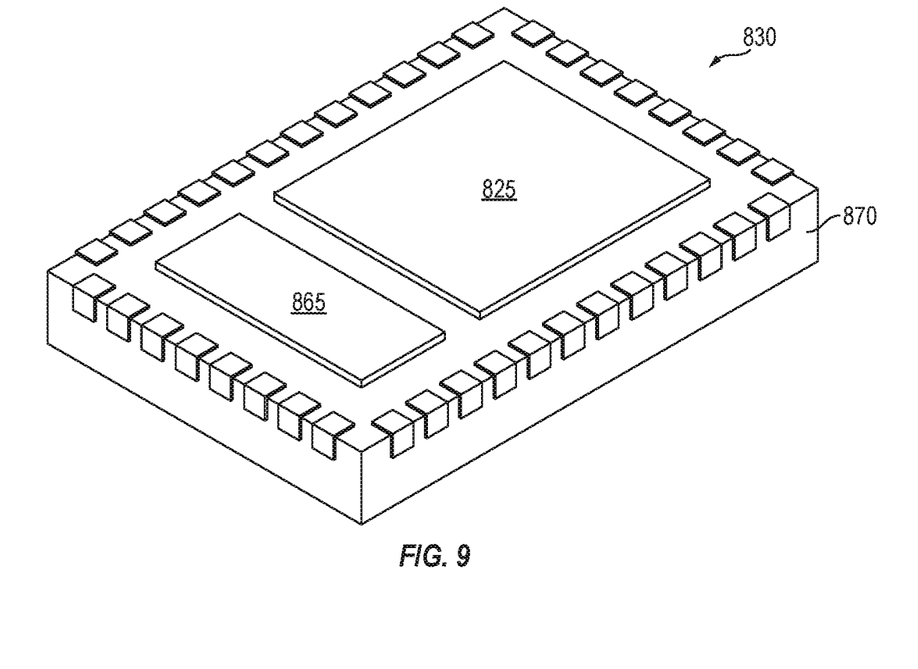
FIG. 9 is a simplified illustration of an isometric view of the bottom surface of the electronic package shown in FIG. 8.

Now referring to FIGS. 8 and 9 one embodiment of a co-packaged transistor with an overvoltage protection circuit is illustrated. FIG. 8 illustrates a view of the co-packaged transistor within the interior of the electronic package. Electronic device 800 includes a power transistor 805 having a source terminal 810, a drain terminal 815 and a gate terminal 820. Power transistor 805 is mounted to a first die pad 825 that is a portion of electronic package 830. Source terminal 810 has a plurality of connections to source pads 835. Gate terminal 820 is connected to gate pad 840. Drain terminal 815 has a plurality of connections to drain pads 845. A diode 850 has an anode terminal 855 and a cathode terminal 860. Diode 850 is mounted to a second die pad 865. Anode terminal 855 is coupled to gate terminal 820.

As illustrated in FIG. 9, an electrically insulative mold compound 870 encapsulates power transistor 805, diode 850 as well as portions of first die pad 825 and second die pad 865. FIG. 9 illustrates an isometric view of the bottom surface of electronic device 800, showing the surface that connects to a printed circuit board or other electronic assembly. Electronic device 800 is illustrated with a quad flat no-lead package, however myriad other types of electronic packages may be used, including but not limited to an organic printed circuit-based multi-chip module, an overmolded gull-wing plastic package such as an SOIC, TO or QFP.

As discussed above, other embodiments may have different configurations of packaged devices. For example, in one embodiment two or more electronic elements may be integrated on a single semiconductor die. In one embodiment a power transistor and a diode are integrated in a single semiconductor die. In another embodiment a power transistor, a drive transistor and/or a pulldown transistor and a diode are integrated on a single die. In yet further embodiments a power transistor, a diode, a pulldown and a pulldown drive transistor are integrated on a single die. In other embodiments a power transistor, a high side transistor, a low side transistor, a pass through transistor, two disable transistors, a comparator circuit, an operational amplifier circuit, a reference voltage circuit and a gate driver circuit may be integrated on a single die. Other embodiments may have more electronic elements or fewer electronic elements integrated on a single die. Yet further embodiments may have one or more electronic elements contained in individual electronic packages or the elements may be co-packaged in any configuration. In some embodiments passive electronic elements such as resistors may be integrated onto a semiconductor die along with active elements, or the passive may be co-packaged with active devices, or the passives may be discrete devices.

In certain embodiments devices integrated on the same die may provide faster response and clamping of the overvoltage condition than devices that are individually packaged. In further embodiments, because of the low inductance of integrated devices, an integrated solution may have improved stability and fewer oscillations than individually packaged devices.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Although electronic circuit 100 (see FIG. 1) is described and illustrated as one particular electronic circuit with particular electronic devices, embodiments of the invention are suitable for use with a multiplicity of electronic circuits and devices. For example, any electronic circuit that has a switch may be used with the invention. In some instances, embodiments of the invention are particularly well suited for use with electronic circuits that have overvoltage transients that may damage the power transistor.

For simplicity, various electronic components, such as the control circuitry, power supply circuitry, and other peripheral circuitry for circuit 100 (see FIG. 1) are not shown in the figures.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. The specific details of particular embodiments may be combined in any suitable manner without departing from the spirit and scope of embodiments of the invention.

Additionally, spatially relative terms, such as "bottom or "top" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface may then be oriented "above" other elements or features. The device may be otherwise oriented (e.g., rotated 90 degrees or at other orientations) and the spatially relative descriptors used herein interpreted accordingly.

What is claimed is:

1. An electronic circuit comprising:
a power transistor having a gate terminal, a source terminal and a drain terminal;
a driver circuit, configured to generate an output which selectively changes a voltage at the gate terminal such that a resistance between the source terminal and the drain terminal changes in response to an input signal, and which selectively presents a high impedance to the gate terminal, wherein the driver circuit comprises a turn-off circuit configured to change the voltage on the gate terminal such that the resistance between the source terminal and the drain terminal increases, and wherein the driver circuit comprises a turn-on circuit configured to change the voltage on the gate terminal such that the resistance between the source terminal and the drain terminal decreases;
an overvoltage protection circuit coupled to the gate terminal of the power transistor, wherein the overvoltage protection circuit is configured to generate one or more overvoltage indication signals in response to an overvoltage potential, wherein, in response to the overvoltage indication signals, the overvoltage protection circuit causes a voltage at the gate terminal to change such that the resistance between the source terminal and the drain terminal decreases, and wherein, in response to the overvoltage indication signals, the driver circuit causes the turn-off circuit to present a substantially open circuit load to the gate terminal;
an amplifier configured to, in response to at least one of the overvoltage indication signals, cause the resistance of the power transistor between the source terminal and the drain terminal to decrease; and
a comparator configured to, in response to at least one of the overvoltage indication signals, cause the gate terminal to be electrically connected to an output of the amplifier.

2. The electronic circuit of claim 1, wherein the comparator is further configured to, in response to at least one of the overvoltage indication signals, cause the turn-off circuit to present the substantially open circuit load to the gate terminal.

3. The electronic circuit of claim 2, wherein the comparator is configured to cause the turn-off circuit to present the substantially open circuit load to the gate terminal before the amplifier causes the resistance between the source terminal and the drain terminal to decrease.

4. The electronic circuit of claim 2, wherein the comparator is further configured to, in response to at least one of the overvoltage indication signals, cause the turn-on circuit to present the substantially open circuit load to the gate terminal.

5. The electronic circuit of claim 4, wherein the comparator is configured to cause the turn-on circuit to present the substantially open circuit load to the gate terminal before the amplifier causes the resistance between the source terminal and the drain terminal to decrease.

6. The electronic circuit of claim 4, wherein the comparator is configured to cause the turn-off circuit to present the substantially open circuit load to the gate terminal before the amplifier causes the resistance between the source terminal and the drain terminal to decrease.

7. The electronic circuit of claim 6, wherein the comparator is configured to cause the turn-on circuit to present the substantially open circuit load to the gate terminal before the amplifier causes the resistance between the source terminal and the drain terminal to decrease.

8. The electronic circuit of claim 1, wherein in response to the resistance between the source terminal and the drain terminal decreasing, a voltage difference between the drain terminal and the source terminal decreases, and wherein, after the voltage difference between the drain terminal and the source terminal has decreased, a drain terminal to source terminal path of the power transistor remains conductive.

9. The electronic circuit of claim 1, wherein the power transistor is disposed on a first die and at least a portion of the overvoltage protection circuit is disposed on a second die that is co-packaged with the first die.

10. The electronic circuit of claim 1, wherein the power transistor and at least one element of the overvoltage protection circuit are integrated on a single GaN-based die.

11. The electronic circuit of claim 1, wherein the power transistor and the turn-off circuit are integrated on a single GaN-based die.

12. An electronic circuit comprising:
   a power transistor having a gate terminal, a source terminal and a drain terminal;
   a driver circuit, configured to generate an output which selectively changes a voltage at the gate terminal such that a resistance between the source terminal and the drain terminal changes in response to an input signal, and which selectively presents a high impedance to the gate terminal, wherein the driver circuit comprises a turn-off circuit configured to change the voltage on the gate terminal such that the resistance between the source terminal and the drain terminal increases, and wherein the driver circuit comprises a turn-on circuit configured to change the voltage on the gate terminal such that the resistance between the source terminal and the drain terminal decreases;
   an overvoltage protection circuit coupled to the gate terminal of the power transistor, wherein the overvoltage protection circuit is configured to generate one or more overvoltage indication signals in response to an overvoltage potential, wherein, in response to the overvoltage indication signals, the overvoltage protection circuit causes a voltage at the gate terminal to change such that the resistance between the source terminal and the drain terminal decreases, and wherein, in response to the overvoltage indication signals, the driver circuit causes the turn-off circuit to present a substantially open circuit load to the gate terminal;
   an amplifier configured to, in response to at least one of the overvoltage indication signals, cause the resistance of the power transistor between the source terminal and the drain terminal to decrease; and
   a comparator configured to, in response to at least one of the overvoltage indication signals, cause the turn-off circuit to present the substantially open circuit load to the gate terminal.

13. The electronic circuit of claim 12, wherein in response to the resistance between the source terminal and the drain terminal decreasing, a voltage difference between the drain terminal and the source terminal decreases, and wherein, after the voltage difference between the drain terminal and the source terminal has decreased, a drain terminal to source terminal path of the power transistor remains conductive.

14. The electronic circuit of claim 12, wherein the power transistor is disposed on a first die and at least a portion of the overvoltage protection circuit is disposed on a second die that is co-packaged with the first die.

15. The electronic circuit of claim 12, wherein the power transistor and at least one element of the overvoltage protection circuit are integrated on a single GaN-based die.

16. The electronic circuit of claim 12, wherein the power transistor and the turn-off circuit are integrated on a single GaN-based die.

17. A method of protecting a power transistor from an overvoltage transient condition, the method comprising:
   holding a power transistor in an off state by connecting a gate of the power transistor to a source of the power transistor through a pull-down switch;
   turning on a drive switch during an overvoltage transient condition by providing a current into a gate of the drive switch through a zener diode coupled between the gate and a drain of the power transistor, the zener diode further coupled to the gate of the drive switch;
   shorting a gate of the pull-down switch to a source of the pull-down switch by a turn-on of the drive switch;
   providing a current through the zener diode into the gate of the power transistor, thereby raising a voltage at the gate of the power transistor and turning on the power transistor during the overvoltage transient condition; and
   discharging an overvoltage transient current through the drain to the source of the power transistor.

18. The method of claim 17, wherein the power transistor and the pull-down switch are integrated on a single GaN-based die.

19. The method of claim 17, wherein the power transistor and the pull-down switch and the drive switch are integrated on a single GaN-based die.

* * * * *